US012696742B2

(12) United States Patent
Kim et al.

(10) Patent No.: US 12,696,742 B2
(45) Date of Patent: Jul. 28, 2026

(54) SEMICONDUCTOR DEVICE INCLUDING METAL LINES HAVING MULTI-LAYER STRUCTURE

(71) Applicant: SAMSUNG ELECTRONICS CO., LTD., Suwon-si (KR)

(72) Inventors: Johnsoo Kim, Clifton Park, NY (US); Joongsuk Oh, Watervliet, NY (US); Kang-Ill Seo, Springfield, VA (US)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/820,847

(22) Filed: Aug. 30, 2024

(65) Prior Publication Data

US 2025/0308995 A1      Oct. 2, 2025

Related U.S. Application Data

(60) Provisional application No. 63/573,194, filed on Apr. 2, 2024.

(51) Int. Cl.
H10W 20/00          (2026.01)
H10W 20/44          (2026.01)

(52) U.S. Cl.
CPC ....... H10W 20/057 (2026.01); H10W 20/033 (2026.01); H10W 20/4421 (2026.01); H10W 20/4441 (2026.01)

(58) Field of Classification Search
CPC ............. H01L 23/4827; H01L 23/5386; H01L 21/02697; H01L 21/28568; H01L 29/43;

H01L 29/41; H01L 23/53228; H01L 23/53238; H01L 23/53257; H01L 23/53266; H01L 21/0332; H01L 21/28; H01L 21/3081; H01L 21/32051; H01L 21/32139; H01L 21/3213; H01L 21/76838; H01L 21/76865; H01L 21/7685; H01L 21/0338; H10W 20/057; H10W 20/033;

(Continued)

(56) References Cited

U.S. PATENT DOCUMENTS

| | | |
|---|---|---|
| 9,111,931 B2 | 8/2015 | Bian |
| 11,177,164 B2 | 11/2021 | Roy et al. |

(Continued)

OTHER PUBLICATIONS

Jungkyun et al., "Electromigration Reliability of Barrierless Ruthenium and Molybdenum for Sub-10 nm Interconnection", ACS Applied Electronic Materials, vol. 5, Issue 5, Apr. 26, 2023. (Year: 2023).*

(Continued)

*Primary Examiner* — Evan G Clinton
(74) *Attorney, Agent, or Firm* — Myers Bigel, P.A.

(57) ABSTRACT

Provided is a semiconductor device which includes: a base layer; and at least one metal line on the base layer, wherein each of the at least one metal line comprise a $1^{st}$ metal structure and a $2^{nd}$ metal structure on the $1^{st}$ metal structure, the $1^{st}$ metal structure is formed through a direct etching process, and the $2^{nd}$ metal structure is formed through a damascene process.

11 Claims, 12 Drawing Sheets

Forming 1st sacrificial structures on an initial 1st metal structure to be arranged in at a 1st pitch — S10

Forming 2nd sacrificial structures on side surfaces of the 1st sacrificial structures — S20

Removing the 1st sacrificial structures to leave only the 2nd sacrificial structures on the initial 1st metal structure — S30

Forming 2nd metal structures in the recess and spaces provided by the removal of the 1st sacrificial structures — S40

Removing the 2nd sacrificial structures to leave only the 2nd metal structures on the initial 1st metal structure — S50

Patterning the initial 1st metal structure based on the 2nd metal structures to form metal lines each of which is formed of a 1st metal structure and a 2nd metal structure — S60

(58) Field of Classification Search
CPC ......... H10W 20/4421; H10W 20/4441; H10W 20/063; H10W 20/036; H10W 20/0633; H10W 20/069; H10W 20/425; H10W 20/438; H10W 20/4432; H10W 20/056; H10W 20/075; H10W 20/089; H10W 20/035; H10P 50/71
See application file for complete search history.

(56) References Cited

U.S. PATENT DOCUMENTS

| | | | |
|---|---|---|---|
| 11,205,592 | B2 | 12/2021 | Xie et al. |
| 11,295,978 | B2 | 4/2022 | Anderson et al. |
| 11,869,808 | B2 | 1/2024 | Clevenger et al. |
| 2016/0379946 | A1* | 12/2016 | Maekawa ............... H01L 24/05 |
| | | | 257/773 |
| 2017/0309626 | A1* | 10/2017 | Cheng ............. H01L 21/823418 |
| 2022/0139823 | A1* | 5/2022 | Lin ................... H01L 21/76841 |
| | | | 257/774 |
| 2022/0199516 | A1 | 6/2022 | Chebiam et al. |
| 2023/0067493 | A1 | 3/2023 | Lanzillo et al. |

OTHER PUBLICATIONS

"Communication pursuant to Article 94(3) EPC", EP Application No. 25166304.3, Jun. 22, 2026, 7 pp.

* cited by examiner

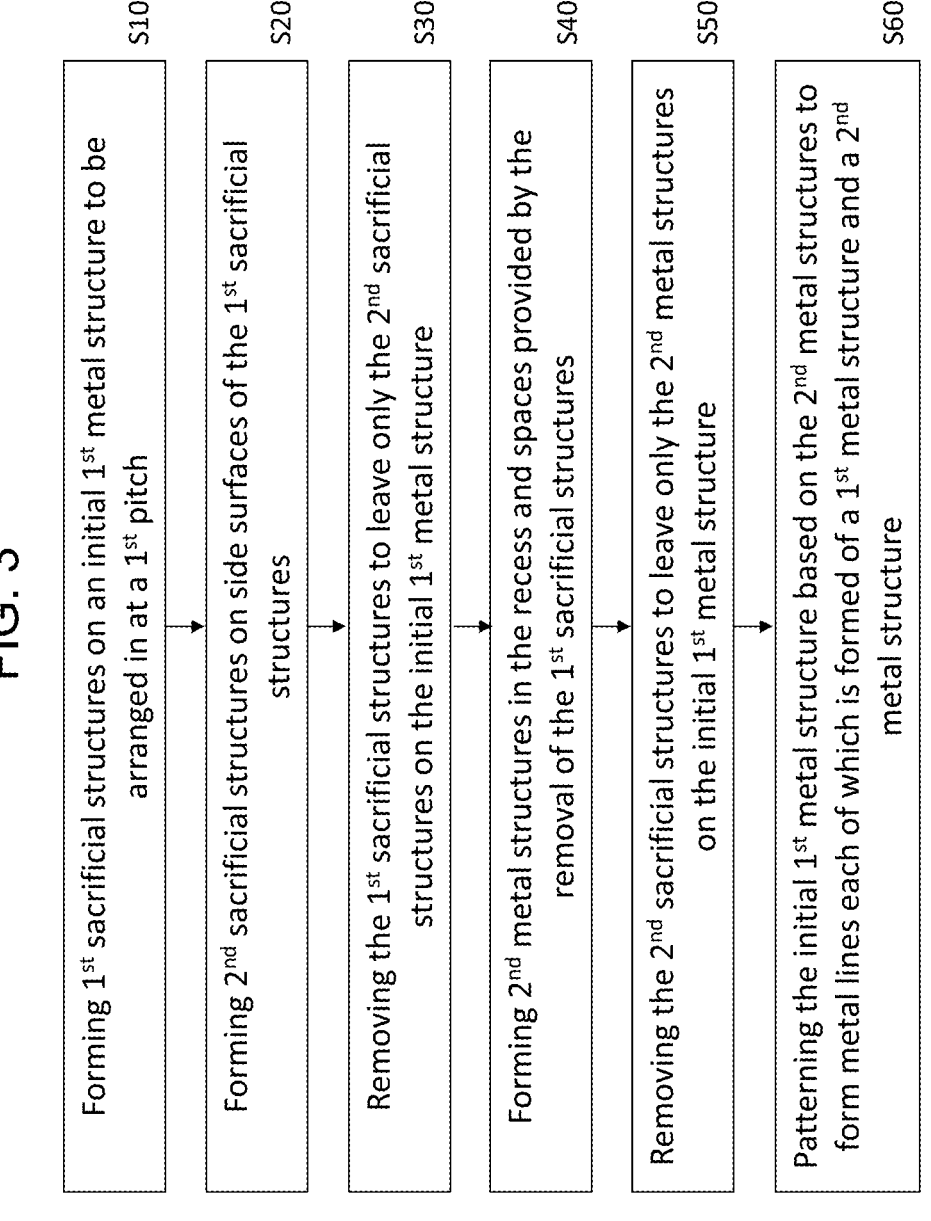

Forming 1st sacrificial structures on an initial 1st metal structure to be arranged in at a 1st pitch — S10

Forming 2nd sacrificial structures on side surfaces of the 1st sacrificial structures — S20

Removing the 1st sacrificial structures to leave only the 2nd sacrificial structures on the initial 1st metal structure — S30

Forming 2nd metal structures in the recess and spaces provided by the removal of the 1st sacrificial structures — S40

Removing the 2nd sacrificial structures to leave only the 2nd metal structures on the initial 1st metal structure — S50

Patterning the initial 1st metal structure based on the 2nd metal structures to form metal lines each of which is formed of a 1st metal structure and a 2nd metal structure — S60

SEMICONDUCTOR DEVICE INCLUDING METAL LINES HAVING MULTI-LAYER STRUCTURE

CROSS-REFERENCE TO RELATED APPLICATIONS

This application is based on and claims priority from U.S. Provisional Application No. 63/573,194 filed on Apr. 2, 2024 in the U.S. Patent and Trademark Office, the disclosure of which is incorporated herein in its entirety by reference.

BACKGROUND

1. Field

Apparatuses and methods consistent with example embodiments of the disclosure relate to a semiconductor device including an interconnect structure in which a metal line has a multi-layer structure.

2. Description of the Related Art

Performance of a semiconductor device is affected by how an interconnect structure is formed in the semiconductor device. The interconnect structure includes a back-end-of-line (BEOL) structure such as metal lines and vias which connect a front-end-of-line (FEOL) structure to a voltage source or other circuit elements directly or through a middle-of-line (MOL) structure. The FEOL structure may include transistor structures such as a channel structure, source/drain regions, and a gate structure, and the MOL structure may include contact plugs formed on the source/drain regions and the gate structures.

As semiconductor devices are developed to have a high device density and performance, forming metal lines having a very fine metal pitch, a high aspect ratio and a high connection performance becomes more challenging than before, and also, demands for metal lines formed of new materials having a lower electrical resistance, a higher resistance of to electromigration, and a higher thermal stability have increased. However, hard-mask patterning to form metal lines having a very fine metal pitch and a high aspect ratio is very difficult to perform.

Information disclosed in this Background section has already been known to the inventors before achieving the embodiments of the present application or is technical information acquired in the process of achieving the embodiments described herein. Therefore, it may contain information that does not form prior art that is already known to the public.

SUMMARY

The disclosure provides example embodiments of an interconnect structure of a semiconductor device in which a metal line may include a $1^{st}$ metal structure and a $2^{nd}$ metal structure formed of different materials and formed through different processes at different steps.

According to one or more embodiments, there is provided a semiconductor device which may include: a base layer; and at least one metal line on the base layer, wherein each of the at least one metal line includes a $1^{st}$ metal structure and a $2^{nd}$ metal structure on the $1^{st}$ metal structure.

According to one or more embodiments, there is provided a method of manufacturing a semiconductor device. The method may include: forming a base layer; and forming at least one metal line on the base layer such that each of the at least one metal line includes a $1^{st}$ metal structure and a $2^{nd}$ metal structure on the $1^{st}$ metal structure, wherein the $1^{st}$ metal structure is formed through a direct etching process, and the $2^{nd}$ metal structure is formed through a damascene process.

According to one or more embodiments, there is provided a method of manufacturing a semiconductor device. The method may include: forming a plurality of 1 st sacrificial structures arranged in a $1^{st}$ direction on an initial $1^{st}$ metal structure; forming a plurality of $2^{nd}$ sacrificial structures on side surfaces of the $1^{st}$ sacrificial structures such that a $2^{nd}$ sacrificial structure on a right side surface of a $1^{st}$ sacrificial structure is spaced apart, by a recess, from another $2^{nd}$ sacrificial structure on a left side surface of another $1^{st}$ sacrificial structure adjacent to the $1^{st}$ sacrificial structure; removing the $1^{st}$ sacrificial structures; forming a plurality of $2^{nd}$ metal structures in the recess and a space provided by the removing of the $1^{st}$ sacrificial structures; removing the $1^{st}$ sacrificial structures; and patterning the initial $1^{st}$ metal structure based on the plurality of $2^{nd}$ metal structures to form a plurality of $1^{st}$ metal structures.

BRIEF DESCRIPTION OF DRAWINGS

Example embodiments of the disclosure will be more clearly understood from the following detailed description taken in conjunction with the accompanying drawings as follows.

FIGS. 2A-2I illustrate cross-section views of an intermediate semiconductor device after respective steps of manufacturing a semiconductor device including metal lines having a multi-layer structure, according to one or more embodiments.

FIG. 3 illustrate a flowchart for a method of manufacturing a semiconductor device including metal lines having a multi-layer structure, in reference to FIGS. 2A-2I, according to one or more other embodiments.

DETAILED DESCRIPTION

Figure 1:
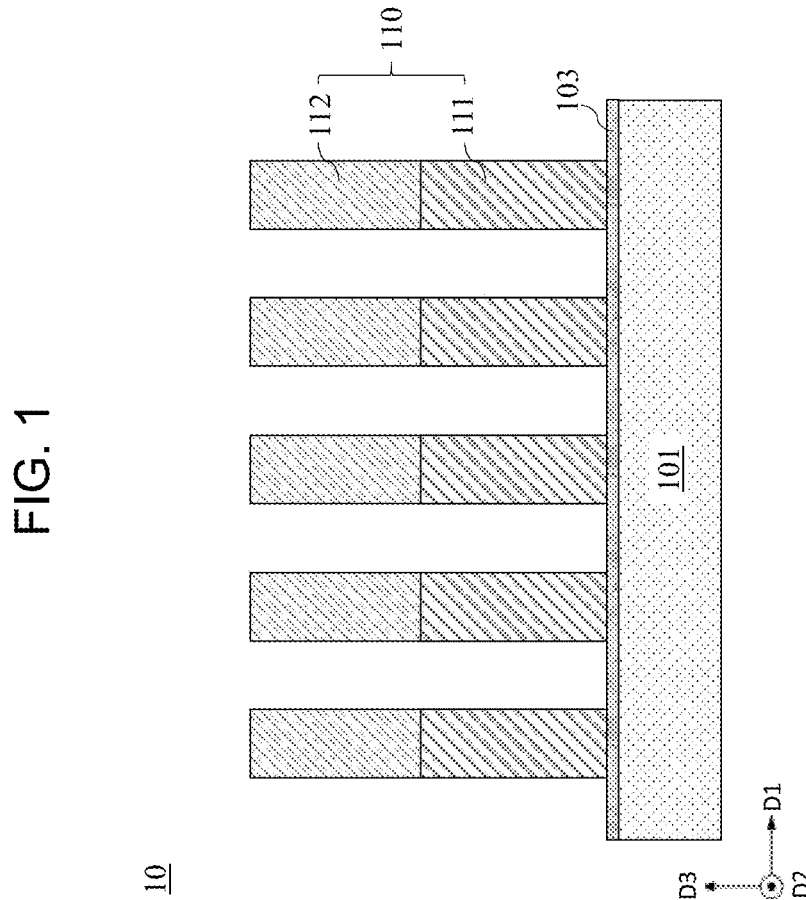
FIG. 1 illustrate a semiconductor device including metal lines having a multi-layer structure, according to one or more embodiments.

The embodiments of the disclosure described herein are example embodiments, and thus, the disclosure is not limited thereto, and may be realized in various other forms. Each of the embodiments provided in the following description is not excluded from being associated with one or more features of another example or another embodiment also provided herein or not provided herein but consistent with the disclosure. For example, even if matters described in a specific example or embodiment are not described in a different example or embodiment thereto, the matters may be understood as being related to or combined with the different example or embodiment, unless otherwise mentioned in descriptions thereof. In addition, it should be understood that all descriptions of principles, aspects, examples, and embodiments of the disclosure are intended to encompass structural and functional equivalents thereof. In addition, these equivalents should be understood as including not only currently well-known equivalents but also equivalents to be developed in the future, that is, all devices invented to perform the same functions regardless of the structures thereof. For example, channel layers, sacrificial layers, and isolation layers described herein may take a different type or form as long as the disclosure can be applied thereto.

It will be understood that when an element, component, layer, pattern, structure, region, or so on (hereinafter collectively "element") of a semiconductor device is referred to as being "over," "above," "on," "below," "under," "beneath," "connected to" or "coupled to" another element the semiconductor device, it can be directly over, above, on, below, under, beneath, connected or coupled to the other element or an intervening element(s) may be present. In contrast, when an element of a semiconductor device is referred to as being "directly over," "directly above," "directly on," "directly below," "directly under," "directly beneath," "directly connected to" or "directly coupled to" another element of the semiconductor device, there are no intervening elements present. Like numerals refer to like elements throughout this disclosure.

Spatially relative terms, such as "over," "above," "on," "upper," "below," "under," "beneath," "lower," "left," "right," "lower-left," "lower-right," "upper-left," "upper-right," "central," "middle," and the like, may be used herein for ease of description to describe one element's relationship to another element(s) as illustrated in the figures. It will be understood that the spatially relative terms are intended to encompass different orientations of a semiconductor device in use or operation in addition to the orientation depicted in the figures. For example, if the semiconductor device in the figures is turned over, an element described as "below" or "beneath" another element would then be oriented "above" the other element. Thus, the term "below" can encompass both an orientation of above and below. The semiconductor device may be otherwise oriented (rotated 90 degrees or at other orientations) and the spatially relative descriptors used herein interpreted accordingly. As another example, when elements referred to as a "left" element and a "right" element" may be a "right" element and a "left" element when a device or structure including these elements are differently oriented. Thus, in the descriptions herebelow, the "left" element and the "right" element may also be referred to as a "$1^{st}$" element or a "$2^{nd}$" element, respectively, as long as their structural relationship is clearly understood in the context of the descriptions. Similarly, the terms a "lower" element and an "upper" element may be respectively referred to as a "$1^{st}$" element and a "$2^{nd}$" element with necessary descriptions to distinguish the two elements.

It will be understood that, although the terms "$1^{st}$," "$2^{nd}$," "$3^{rd}$," "$4^{th}$," "$5^{th}$" "$6^{th}$" etc. may be used herein to describe various elements, these elements should not be limited by these terms. These terms are only used to distinguish one element from another element. Thus, a $1^{st}$ element discussed below could be termed a $2^{nd}$ element without departing from the teachings of the disclosure.

As used herein, expressions such as "at least one of," when preceding a list of elements, modify the entire list of elements and do not modify the individual elements of the list. For example, the expression, "at least one of a, b and c," should be understood as including only a, only b, only c, both a and b, both a and c, both b and c, or all of a, b and c. Herein, when a term "same" or "equal" is used to compare a dimension of two or more elements, the term may cover a "substantially same" or "substantially equal" dimension.

It will be also understood that, even if a certain step or operation of manufacturing an apparatus or structure is described later than another step or operation, the step or operation may be performed later than the other step or operation unless the other step or operation is described as being performed after the step or operation.

Many embodiments are described herein with reference to cross-sectional views that are schematic illustrations of the embodiments (and intermediate structures). As such, variations from the shapes of the illustrations as a result, for example, of manufacturing techniques and/or tolerances, are to be expected. Thus, the embodiments should not be construed as limited to the particular shapes of regions illustrated herein but are to include deviations in shapes that result, for example, from manufacturing. Various regions illustrated in the figures are schematic in nature and their shapes are not intended to illustrate the actual shape of a region of a device and are not intended to limit the scope of the disclosure. Further, in the drawings, the sizes and relative sizes of layers and regions may be exaggerated for clarity.

For the sake of brevity, conventional elements of a semiconductor device may or may not be described in detail herein or shown in the drawings. For example, MOL or FEOL structures may not be shown or described in detail when these structures are not relevant to the concept of the disclosure.

Herebelow, various embodiments of the disclosure are described in reference to the accompanying drawings.

FIG. 1 illustrate a semiconductor device including metal lines having a multi-layer structure, according to one or more embodiments.

Referring to FIG. 1, a semiconductor device 10 may include an interconnect structure including a plurality of metal lines 110 arranged in a D1 direction and extended in a D2 direction intersecting the D1 direction on a base layer 101. The metal lines 110 may all be formed at a same metal layer or at a same level on the base layer 101. For example, when the interconnect structure of the semiconductor device 10 has a plurality of metal layers, the metal lines 110 may be formed in a single metal layer. The metal lines 110 may be isolated from each other by an air gap or a dielectric layer surrounding the metal lines 110.

The metal lines 110 may be arranged in the D1 direction at a predetermined pitch. However, the metal lines 110 may not be arranged in the D1 direction to have the predetermined pitch, and instead, a distance between two adjacent metal lines among the metal line 110 may be different from a distance between other two adjacent metal lines among the metal lines 110, according to one or more other embodiments.

The metal lines 110 may each include a 1st metal structure 111 and a 2nd metal structure 112. The interconnect structure including the metal lines 110 may be a BEOL structure, for example, not being limited thereto. When the base layer 101 is a BEOL structure, the base layer 101 may be another BEOL structure, an MOL structure, or an FEOL structure. The 1st metal structures 111 may be formed at a same level, and thus, top surfaces of the 1st metal structures 111 may be horizontally coplanar or aligned. The 2nd metal structures 112 may be formed at a same level, and thus, top surfaces of the 2nd metal structures 112 may be horizontally coplanar or aligned. The top surfaces of the 1st metal structures 111 may contact bottom surfaces of the 2nd metal structures 112, and thus, no other metal line or via connecting two metal lines at different levels or layers may be formed between a 1st metal structure 111 and a 2nd metal structure 112 thereon.

The $1^{st}$ metal structure 111 and the $2^{nd}$ metal structure 112 may be formed at different steps in manufacturing the interconnect structure of the semiconductor device 10, as will be described later in reference to FIGS. 2A-2I. The $1^{st}$ metal structure 111 and the $2^{nd}$ metal structure 112 may be formed of different materials. Thus, a barrier, an interface, or a connection surface may be formed between the $1^{st}$ metal structure 111 and the $2^{nd}$ metal structure 112.

The $1^{st}$ metal structure 111 may be formed of a material having a high etch selectivity, a high resistivity to electromigration and a high thermal stability. The $1^{st}$ metal structure 111 may be formed through a direct etching on an initial $1^{st}$ metal structure due to the high etch selectivity thereof. The $1^{st}$ metal structure 111 may be formed of ruthenium (Ru), aluminum (Al), etc., not being limited thereto.

In contrast, the $2^{nd}$ metal structure 112 may be formed of a material having a low etch selectivity but a high material selectivity, a high conductivity with a low electrical resistance. The $2^{nd}$ metal structure 112 may be formed of copper (Cu), tungsten (W), molybdenum (Mo), etc., not being limited thereto. The $2^{nd}$ metal structure 112 may be formed through a damascene process at least because of the low etch selectivity of the material forming the $2^{nd}$ metal structure 112. It is to be understood that the lower the etch selectivity and the higher the material selectivity of a material, the more difficult it is to etch.

As will be described later in reference to FIGS. 2A-2I, the metal lines 110 may be formed by using the $2^{nd}$ metal structures 112 as a masking structure due to the low etch selectivity and the high material selectivity of the material forming the $2^{nd}$ metal structures 122. Thus, it may be possible to avoid using one or more hard mask patterns which may not be able to sustain patterning of metal lines having a very fine pitch and a high aspect ratio. Further, the $2^{nd}$ metal structures 112 of a low electrical resistance may remain to be connected to the $1^{st}$ metal structures 111 respectively therebelow after being used as the masking structure, and thus, an overall electrical resistance of the metal lines 110 may decrease, compared to the metal lines 110 formed of only the $1^{st}$ metal structures 111. Moreover, due to the high resistivity to electromigration of the $1^{st}$ metal structures 111, an overall resistivity to electromigration may increase. Thus, the semiconductor device 10 may include the metal lines 110 of a multi-layer structure having a very fine pitch, a high aspect ratio, and an enhanced electrical performance.

An etch stop layer 103 may be formed below the metal lines 110, on the base layer 101. Although FIG. 1 shows that the etch stop layer 103 is a connected layer extended in the D1 direction on the base layer 101, the etch stop layer 103 may be formed below only each metal line 110, and may not be disconnected between two adjacent metal lines 100, exposing a top surface of the base layer 101, according to one or more other embodiments. The etch stop layer 103 may have been used in patterning the metal lines 110 on the base layer 101, and may have remained thereon. The etch-stop layer 103 may be formed of a material such as aluminum nitride (AlN), aluminum oxide ($AlO_2$), tantalum nitride (TaN), etc., not being limited thereto.

Herebelow, a method of manufacturing the semiconductor device 10 including an interconnect structure including a plurality of metal lines 110 is provided in reference to FIGS. 2A-2I.

FIGS. 2A-2I illustrate cross-section views of an intermediate semiconductor device after respective steps of manufacturing a semiconductor device including metal lines having a multi-layer structure, according to one or more embodiments.

The semiconductor device manufactured in reference to FIGS. 2A-2I may be or correspond to the semiconductor device 10 shown in FIG. 1. Thus, duplicate descriptions about the same structural elements described above in reference to FIG. 1 may be omitted, and the same reference numerals and characters shown in FIG. 1 may be used in the description herebelow.

Figure 2A:
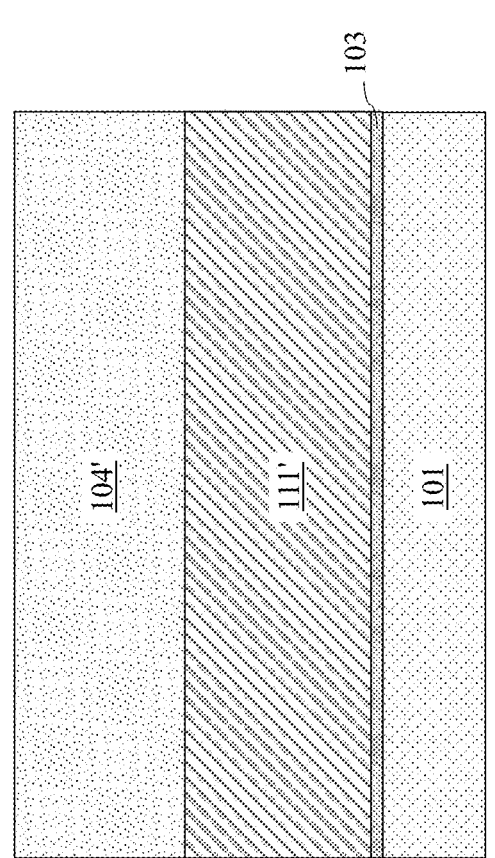

Referring to FIG. 2A, an initial $1^{st}$ metal structure 111' may be formed on a base layer 101 with an etch stop layer 103 therebetween, and an initial mandrel 104' may be formed on the initial $1^{st}$ metal structure 111'.

The initial $1^{st}$ metal structure 111' may be formed through, for example, depositing a material having a high etch selectivity, a high resistivity to electromigration and a high thermal stability on the base layer 101 with the etch stop layer 103 therebetween, followed by planarization at top thereof. The material forming the initial $1^{st}$ metal structure 111 may be ruthenium (Ru), aluminum (Al), etc., not being limited thereto.

The initial mandrel 104' may also be formed through, for example, depositing a dielectric material such as silicon nitride (e.g., SiN) on the initial $1^{st}$ metal structure 111', followed by planarization at top thereof.

The deposition method used in this step may include physical vapor deposition (PVD), chemical vapor deposition (CVD), plasma enhanced chemical vapor deposition (PECVD), atomic layer deposition (ALD), etc., or their combination, and the planarization may performed by a chemical-mechanical polishing (CMP) operation, not being limited thereto.

The initial $1^{st}$ metal structure 111' and the initial mandrel 104' may each be extended in both the D1 direction and the D2 direction intersecting the D1 direction.

Figure 2B:
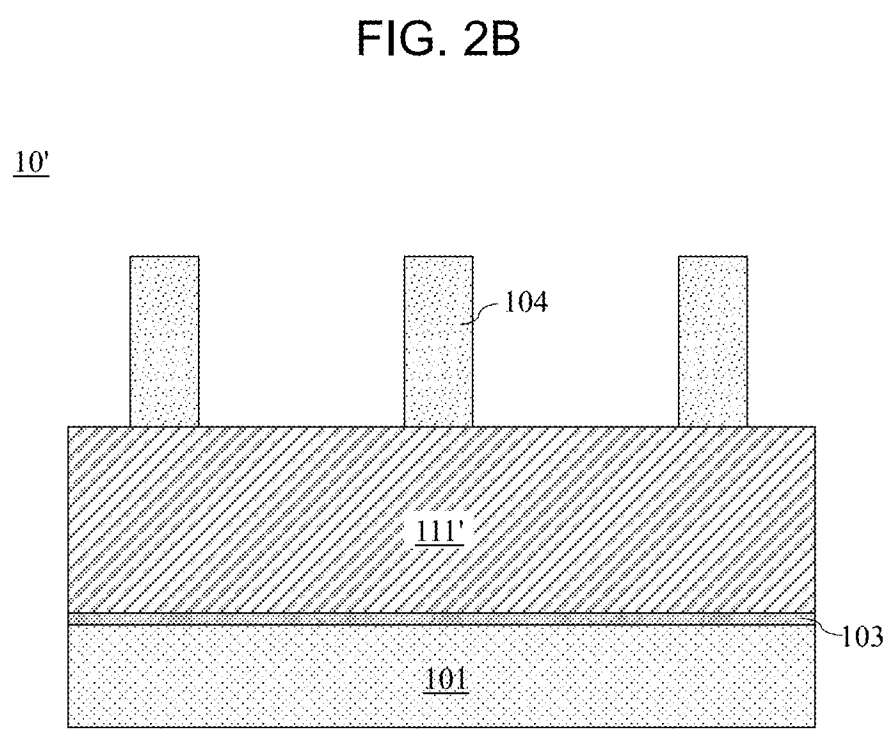

Referring to FIG. 2B, the initial mandrel 104 may be patterned to form a plurality of mandrels 104 arranged at a $1^{st}$ pitch in the D1 direction on the initial $1^{st}$ metal structure 111'.

The formation of the $1^{st}$ mandrels 104 may be performed through, for example, photolithography, masking and etching operations, not being limited thereto. By the patterning the initial mandrel 104' in this step, a top surface of the initial $1^{st}$ metal structure 111' may be exposed between the mandrels 104.

Figure 2C:
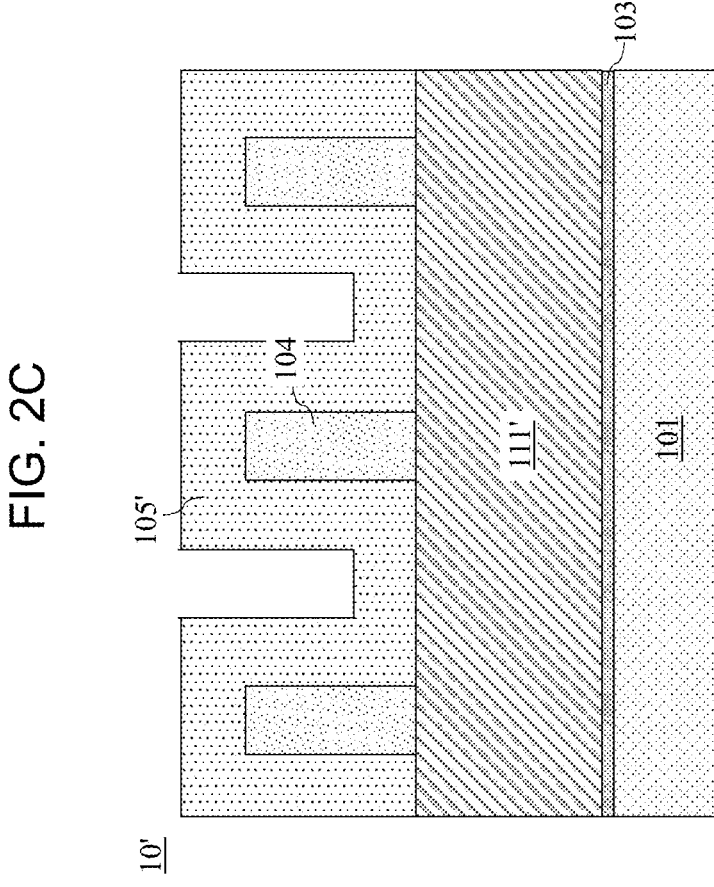

Referring to FIG. 2C, an initial spacer layer 105' may be conformally formed along a profile of the mandrels 104.

The formation of the initial spacer layer 105' may be performed through, for example, depositing a material such as titanium nitride (TiN) or titanium nitride (TaN) by an ALD operation, not being limited thereto. By the conformal deposition, the spacer layer 105 may be formed on a top surface and side surfaces of each of the mandrels 104 and a top surface of the initial $1^{st}$ metal structure 111' exposed between the mandrels 104.

Figure 2D:
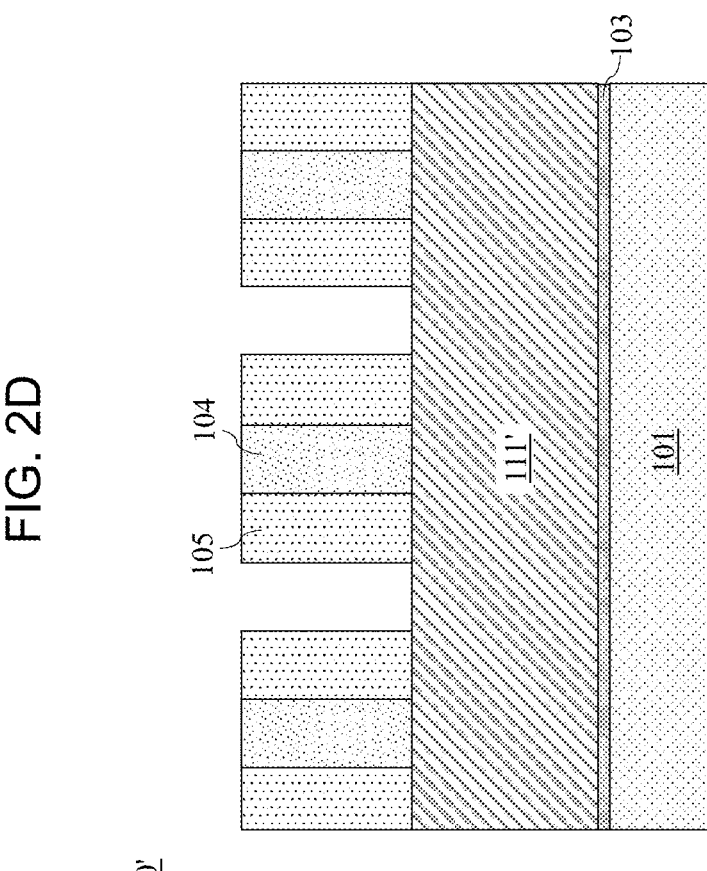

Referring to FIG. 2D, the initial spacer layer 105' may be patterned to form a plurality of spacer layers 105 on the side surfaces of the mandrels 104.

The patterning of the initial spacer layer 105' may be performed through, for example, dry etching, not being limited thereto, such that portions of the initial spacer layer 105' are removed to expose the top surface of each of the mandrels 104 and to remove portions of the initial spacer layer 105' on the top surface of the initial $1^{st}$ metal structure 111' so that the top surface of the initial $1^{st}$ metal structure 111' therebelow is exposed. Further, by the patterning of the initial spacer layer 105' in this step, top surfaces of the spacer layers 105 may be horizontally aligned or coplanar with the top surfaces of the mandrels 104.

Figure 2E:
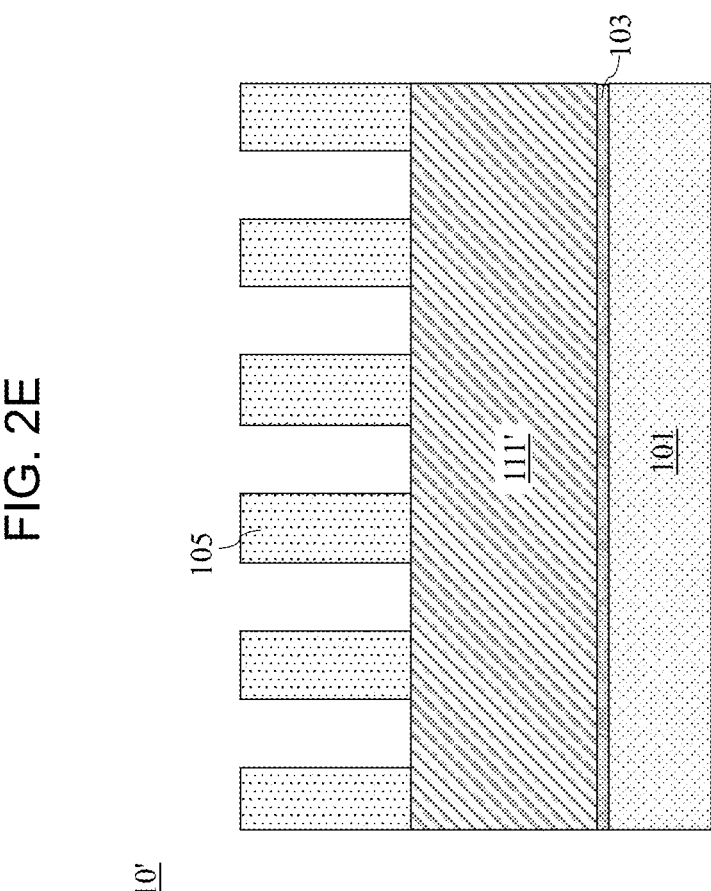

Referring to FIG. 2E, the mandrels 104 may be pulled out to leave only the spacer layers 105 on the initial $1^{st}$ metal structure 111'.

The mandrels 104 may be removed through, for example, dry etching, not being limited thereto. After removal of the mandrels 104, the spacer layers 105 may be arranged on the top surface of the initial $1^{st}$ metal structure 111' at a $2^{nd}$ pitch in the D1 direction which is smaller than the $1^{st}$ pitch.

Figure 2F:
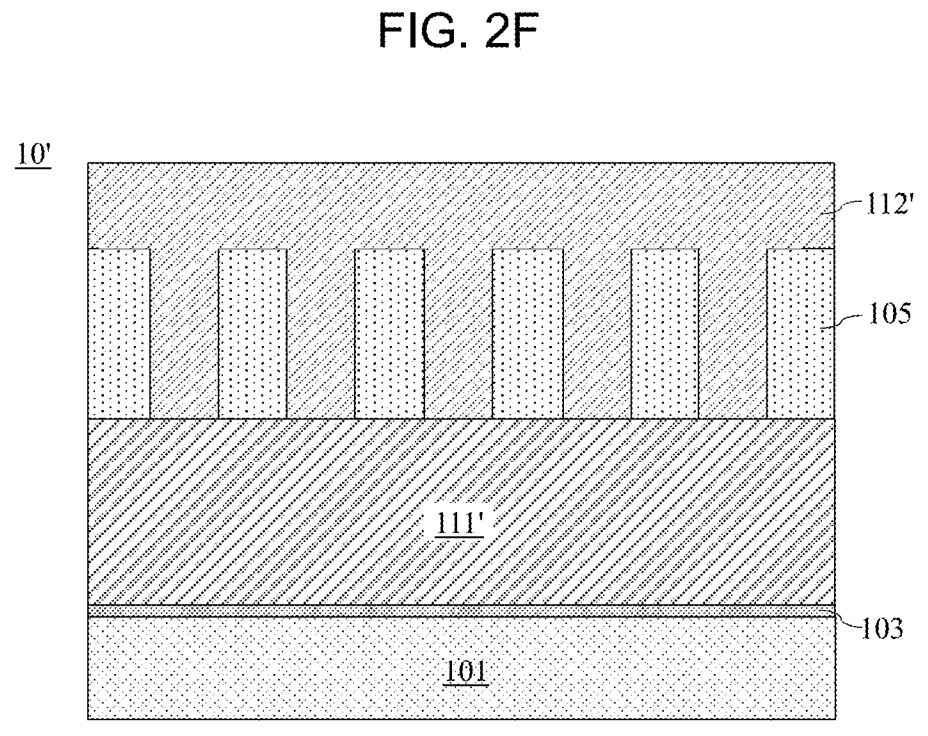

Referring to FIG. 2F, an initial $2^{nd}$ metal structure 112' may be formed on the spacer layers 105 such that the initial $2^{nd}$ metal structure 112' entirely fills out spaces between the spacer layers 105.

The formation of the initial $2^{nd}$ metal structure 112' may be performed through, for example, depositing a material such as copper (Cu), tungsten (W), molybdenum (Mo), etc. which may have a low etch selectivity but a high material selectivity, a high conductivity with a low electrical resistance by PVD, CVD, PECVD, etc., or a combination thereof, not being limited thereto.

Figure 2G:
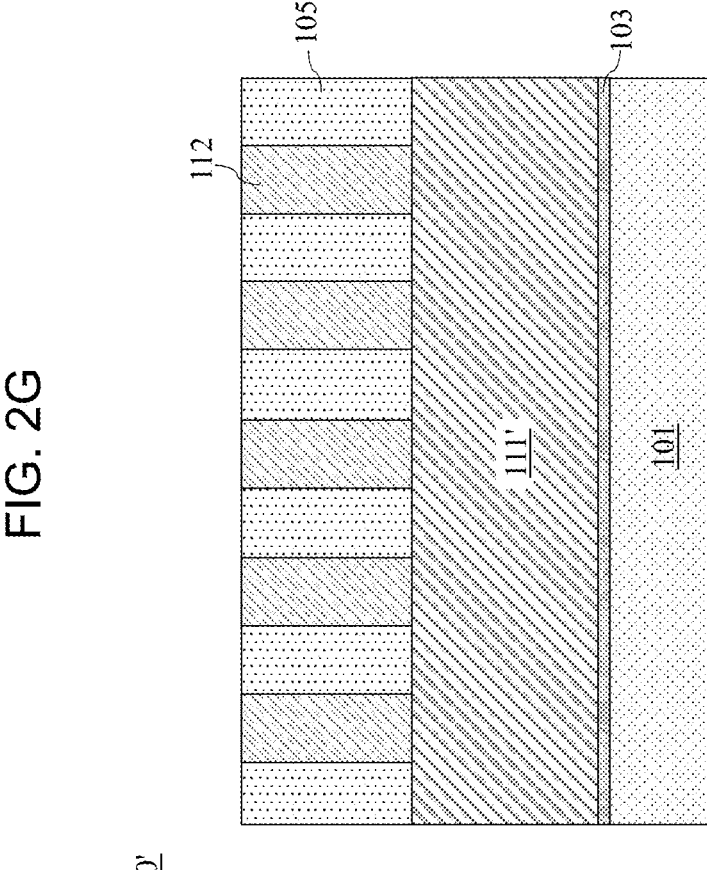

Referring to FIG. 2G, the intermediate semiconductor device 10' obtained in the previous step (FIG. 2F) may be planarized to remove a portion of the initial $2^{nd}$ metal structure 112' formed above a level of top surfaces of the spacer layers 105, thereby forming a plurality of $2^{nd}$ metal structures 112.

The removal of the portion of the initial $2^{nd}$ metal structure 112' may be performed by a planarization operation such as a CMP operation such that top surfaces of the spacer layer 105 may be horizontally coplanar or aligned with top surfaces of the $2^{nd}$ metal structures 112.

Figure 2H:
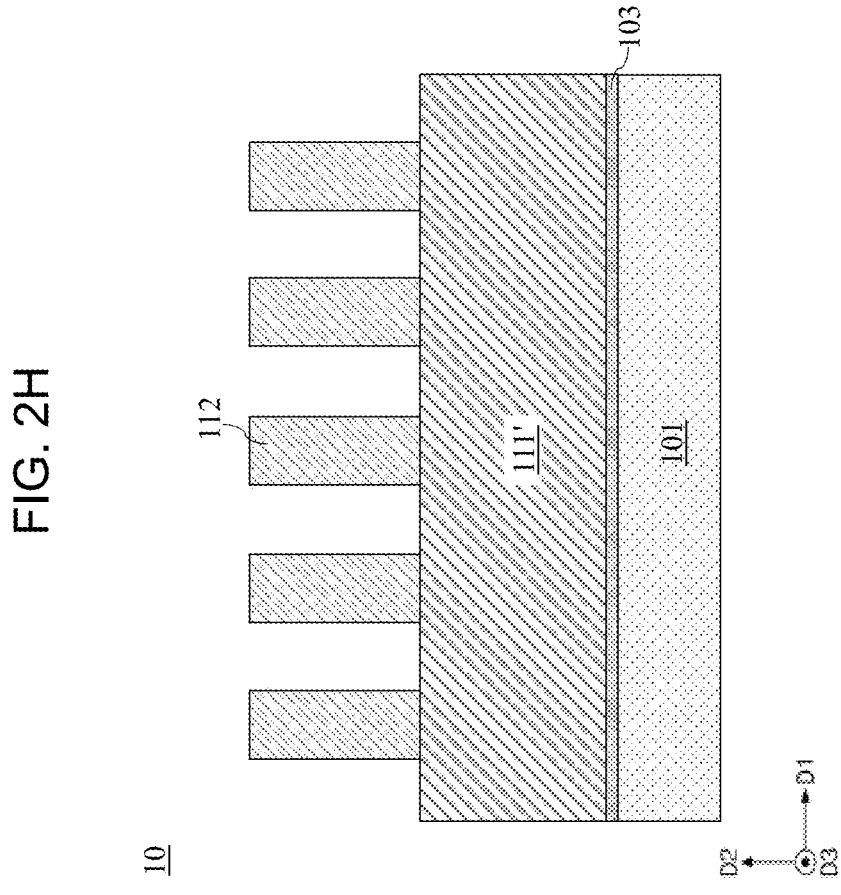

Referring to FIG. 2H, the spacer layers 105 between the $2^{nd}$ metal structures 112 may be removed to leave only the $2^{nd}$ metal structures 112 arranged in the D1 direction at the $2^{nd}$ pitch on the initial $1^{st}$ metal structure 101.

The removal of the spacer layers 105 may be performed through, for example, dry etching or wet etching, not being limited thereto.

Thus, the foregoing damascene process using the mandrels 104 may enable formation of the $2^{nd}$ metal structures 112 having a very fine pitch.

Figure 2I:
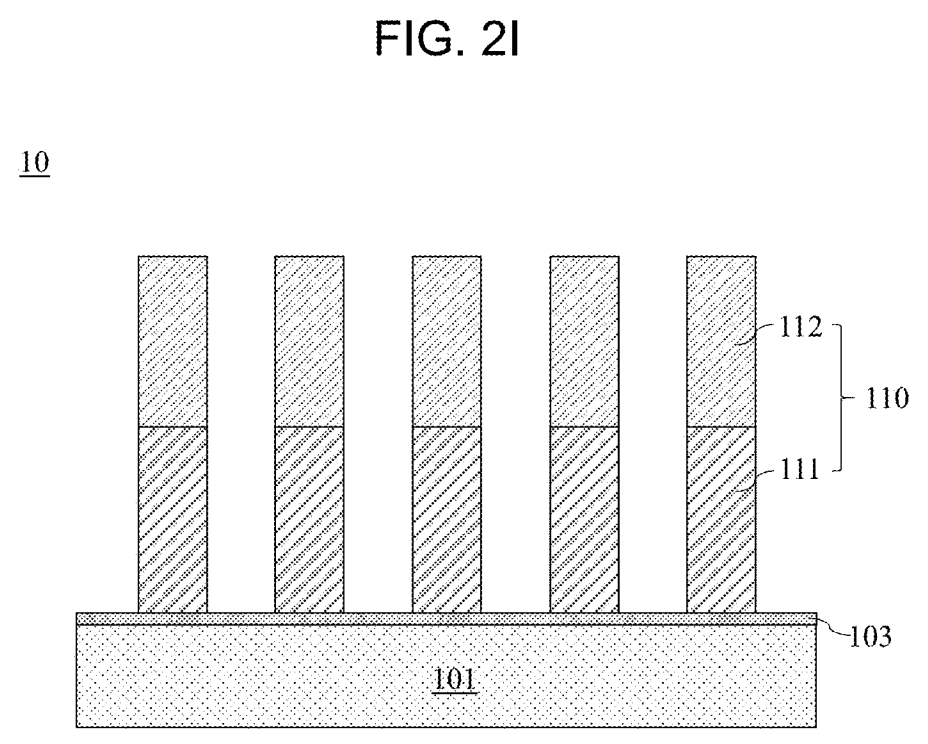

Referring to FIG. 2I, the initial $1^{st}$ metal structure 111' may be patterned to form a plurality of $1^{st}$ metal structures 111 below the $2^{nd}$ metal structures 112, respectively, based on the $2^{nd}$ metal structures 112, thereby forming a plurality of metal lines 110 having a multi-layer structure.

The patterning of the initial $1^{st}$ metal structure 111' may be performed by direct etching, for example, dry etching, based on the $2^{nd}$ metal structures 112 as a masking structure due to the low etch selectivity and the high material selectivity of the material (e.g., Cu, W, Mo, etc.) forming the $2^{nd}$ metal structures 112. Thus, a plurality of multi-layer metal lines 110 each having the $1^{st}$ metal structure 111 and the $2^{nd}$ metal structure 112 may be formed at the $2^{nd}$ pitch in the D2 direction on the base layer 101 for a semiconductor device 10.

As described above, the material forming the $2^{nd}$ metal structures 112 is very difficult to etch, and thus, the $2^{nd}$ metal structures 112 may be formed through a damascene process. Further, the $2^{nd}$ metal structures 112 may provide a better structural property as a masking structure than other hard mask materials for direct etching of the initial $1^{st}$ metal structure 111' formed of a material such as Ru. Thus, the above steps including the damascene process for the $2^{nd}$ metal structures and the direct etching process for the $1^{st}$ metal structures may enable formation of the metal lines 110 having a very fine pitch and a high aspect ratio, which is very difficult to achieve through a single process of the damascene process or the direct etching process.

In addition, as the $2^{nd}$ metal structures 112 formed though the damascene process is a material such as Cu, Al, Mo., etc.

having a low electrical resistance, an overall electrical resistance of the metal lines 110 may decrease, compared to the metal lines 110 formed of only the $1^{st}$ metal structures 111. Moreover, due to the high resistivity to electromigration of the material, e.g., Ru, forming the $1^{st}$ metal structures 111, an overall resistivity to electromigration may increase in the metal lines 110.

Thus, the semiconductor device 10 may include the metal lines 110 of a multi-layer structure having a very fine pitch, a high aspect ratio, and an enhanced electrical performance.

FIG. 3 illustrate a flowchart for a method of manufacturing a semiconductor device including metal lines having a multi-layer structure, in reference to FIGS. 2A-2I, according to one or more other embodiments.

In step S10, a plurality of $1^{st}$ sacrificial structures may be formed on an initial $1^{st}$ metal structure to be arranged in a D1 direction at a $1^{st}$ pitch (FIGS. 2A-2B). The initial $1^{st}$ metal structure may be formed of a material such as ruthenium (Ru), not being limited thereto, and the $1^{st}$ sacrificial structures may be referred to as a mandrel formed of a dielectric material such as silicon nitride (e.g., SiN), not being limited thereto. The formation of the $1^{st}$ sacrificial structures may be performed through, for example, photolithography, masking and etching operations.

In step S20, a plurality of $2^{nd}$ sacrificial structures may be formed on side surfaces of the $1^{st}$ sacrificial structures such that a $2^{nd}$ sacrificial structure on a right side surface of a $1^{st}$ sacrificial structure is spaced apart, by a recess, from another $2^{nd}$ sacrificial structure on a left side surface of another $1^{st}$ sacrificial structure adjacent to the $1^{st}$ sacrificial structure (FIGS. 2C-2D). The formation of the $2^{nd}$ sacrificial structures, which may be referred to as spacer layers, may be performed through, for example, atomic layer deposition (ALD) of a material such as titanium nitride (TiN) or titanium nitride (TaN) followed by dry etching so that top surfaces of the $1^{st}$ sacrificial structures and the $2^{nd}$ sacrificial structures are horizontally coplanar or aligned.

In step S30, the $1^{st}$ sacrificial structures may be removed leaving only the $2^{nd}$ sacrificial structures on the initial $1^{st}$ metal structure (FIG. 2E). The removal of the $1^{st}$ sacrificial structures may be performed through, for example, dry etching. By the removal of the $1^{st}$ sacrificial structures, the $2^{nd}$ sacrificial structures may be arranged at a $2^{nd}$ pitch in the D1 direction on the initial $1^{st}$ metal structure.

In step S40, a plurality of $2^{nd}$ metal structures may be formed in one or more of recesses and one or more spaces provided by the removal of the $1^{st}$ sacrificial structures (FIGS. 2F-2G). The formation of the $2^{nd}$ metal structures may be performed through, for example, depositing a material such as copper (Cu), tungsten (W), molybdenum (Mo), etc. by PVD, CVD, PECVD, etc., not being limited thereto, followed by, a CMP operation.

In step S50, the $2^{nd}$ sacrificial structures may be removed leaving only the $2^{nd}$ metal structures on the initial $1^{st}$ metal structure (FIG. 2H). The removal of the $2^{nd}$ sacrificial structures may be performed through, for example, dry etching or wet etching, not being limited thereto. By the removal of the $2^{nd}$ sacrificial structures, the $2^{nd}$ metal structures may be arranged at the $2^{nd}$ pitch in the D1 direction on the initial $1^{st}$ metal structure.

In step S60, the initial $1^{st}$ metal structure may be patterned based on the $2^{nd}$ metal structures to form a plurality of $1^{st}$ metal structures respectively formed below the $2^{nd}$ metal structures, thereby forming a plurality of metal lines each of which is formed of a $1^{st}$ metal structure and a $2^{nd}$ metal structure (FIG. 2I). The patterning of the initial $1^{st}$ metal structure may be performed by direct etching, for example, dry etching, based on the $2^{nd}$ metal structures as a masking structure.

Figure 4:
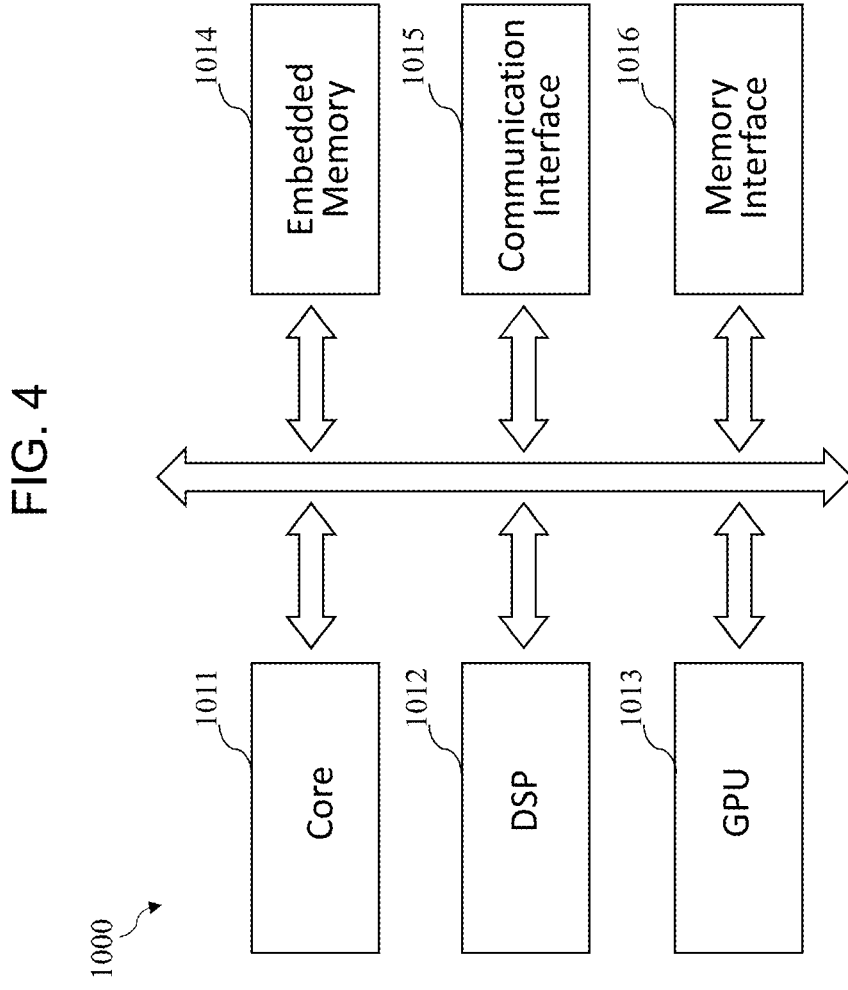
FIG. 4 is a block diagram of a system-on-chip (SoC) 1000 including a semiconductor device including metal lines having a multi-layer structure as shown in FIG. 1, according to one or more embodiments.

FIG. 4 is a block diagram of a system-on-chip (SoC) 1000 including a semiconductor device including metal lines having a multi-layer structure as shown in FIG. 1, according to one or more embodiments.

Referring to FIG. 4, an SoC 1000 may be an integrated circuit in which components of a computing system or other electronic systems are integrated. As an example of the SoC 1000, an application processor (AP) may include at least one processor and components for various functions. The SoC 1000 may include a core 1011 (e.g., a processor), a digital signal processor (DSP) 1012, a graphic processing unit (GPU) 1013, an embedded memory 1014, a communication interface 1015, and a memory interface 1016. The components of the SoC 1000 may communicate with each other through a bus 1007.

The core 1011 may process instructions and control operations of the components included in the SoC 1000. For example, the core 1011 may process a series of instructions to run an operating system and execute applications on the operating system. The DSP 1012 may generate useful data by processing digital signals (e.g., a digital signal provided from the communication interface 1015). The GPU 1013 may generate data for an image output by a display device from image data provided from the embedded memory 1014 or the memory interface 1016, or may encode the image data.

The embedded memory 1014 may store data for use by the core 1011, the DSP 1012, and the GPU 1013. The communication interface 1015 may provide an interface for a communication network or one-to-one communication. The memory interface 1016 may provide an interface for an external memory of the SoC 1000, such as a dynamic random access memory (RAM) (DRAM), a flash memory, etc.

At least one of the core 1011, the DSP 1012, the GPU 1013, and/or the embedded memory 1014 may include a semiconductor device shown in FIG. 1 including metal lines having a multi-layer structure.

The foregoing is illustrative of example embodiments and is not to be construed as limiting the disclosure. Although a few example embodiments have been described, those skilled in the art will readily appreciate that many modifications are possible in the above embodiments without materially departing from the disclosure.

What is claimed is:

1. A method of manufacturing a semiconductor device, the method comprising:

forming a base layer; and forming at least one metal line on the base layer such that each of the at least one metal line comprises a $1^{st}$ metal structure and a $2^{nd}$ metal structure on the $1^{st}$ metal structure, wherein the $1^{st}$ metal structure is patterned from an initial $1^{st}$ metal structure on which an initial sacrificial structure is formed, and the initial sacrificial structure is patterned to form at least one sacrificial structure, wherein the $2^{nd}$ metal structure is formed on the initial $1^{st}$ metal structure at a space from which the at least one sacrificial structure is removed by entirely replacing the at least one sacrificial structure, wherein a width of the $2^{nd}$ metal structure in a $1^{st}$ direction is formed equal to a width of the at least one sacrificial structure in the $1^{st}$ direction, wherein the $2^{nd}$ metal structure is formed to provide an electrical connectivity to the $1^{st}$ metal structure, wherein the $1^{st}$ direction is parallel with an upper surface of the base layer, and wherein the $2^{nd}$ metal structure is formed through a damascene process.

2. The method of claim 1, wherein the $1^{st}$ metal structure is formed through a direct etching process.

3. The method of claim 2, wherein the $1^{st}$ metal structure is formed based on the $2^{nd}$ metal structure as a masking structure.

4. The method of claim 1, wherein the forming the at least one metal line comprise forming a plurality of metal lines at a same level, wherein each of the plurality of metal lines comprises the $1^{st}$ metal structure and the $2^{nd}$ metal structure on the $1^{st}$ metal structure, wherein the $1^{st}$ metal structures of the plurality of metal lines are formed through a direct etching process, and the $2^{nd}$ metal structures of the plurality of metal lines are formed through the damascene process, and wherein the damascene process is performed prior to the direct etching process.

5. The method of claim 4, wherein the $1^{st}$ metal structures are formed based on the $2^{nd}$ metal structures as respective masking structures.

6. The method of claim 1, wherein the forming at least one metal line is performed such that:

the $1^{st}$ metal structure and the $2^{nd}$ metal structure have a same width in the $1^{st}$ direction; and left and right side surfaces of the $1^{st}$ metal structure and left and right side surfaces of the $2^{nd}$ metal structure are vertically aligned or coplanar, respectively.

7. The method of claim 1, wherein the forming the at least one metal line comprises:

providing the $1^{st}$ metal structure formed of a material having a higher resistivity to electromigration than a material forming the $2^{nd}$ metal structure, and providing the $2^{nd}$ metal structure formed of a material having a higher conductivity than a material forming the $1^{st}$ metal structure.

8. The method of claim 1, wherein the forming the at least one metal line comprises:

providing the $1^{st}$ metal structure formed of ruthenium (Ru), and providing the $2^{nd}$ metal structure formed of copper (Cu), tungsten (W) or molybdenum (Mo).

9. A method of manufacturing a semiconductor device, the method comprising:

forming a plurality of $1^{st}$ sacrificial structures of a dielectric material to be arranged in a $1^{st}$ direction on an initial $1^{st}$ metal structure, the plurality of $1^{st}$ sacrificial structures having a thickness extending vertically with respect to the $1^{st}$ direction;

forming a plurality of $2^{nd}$ sacrificial structures on side surfaces of the plurality of $1^{st}$ sacrificial structures such that a $2^{nd}$ sacrificial structure of the plurality of $2^{nd}$ sacrificial structures on a right side surface of a $1^{st}$ sacrificial structure of the plurality of $1^{st}$ sacrificial structures is spaced apart, by a recess, from another $2^{nd}$ sacrificial structure of the plurality of $2^{nd}$ sacrificial structures on a left side surface of another $1^{st}$ sacrificial structure of the plurality of $1^{st}$ sacrificial structures adjacent to the $1^{st}$ sacrificial structure;

removing the plurality of $1^{st}$ sacrificial structures;

filling out, along an entirety of the thickness, the recess and a space provided by the removing of the plurality of 1$^{st}$ sacrificial structures with a plurality of 2$^{nd}$ metal structures by a damascene process;

removing the plurality of 2$^{nd}$ sacrificial structures; and patterning the initial 1$^{st}$ metal structure based on the plurality of 2$^{nd}$ metal structures to form a plurality of 1$^{st}$ metal structures, wherein widths of the plurality of 2$^{nd}$ metal structures in the 1$^{st}$ direction are formed equal to corresponding widths of the plurality of 1$^{st}$ sacrificial structures in the 1$^{st}$ direction, wherein the plurality of 2$^{nd}$ metal structures remain on the plurality of 1$^{st}$ metal structures without being removed, and wherein the 1$^{st}$ direction is parallel with an upper surface of the initial 1$^{st}$ metal structure.

10. The method of claim 9, wherein a material forming the initial 1$^{st}$ metal structure has a higher resistivity to electromigration than a material forming the plurality of 2$^{nd}$ metal structures, and wherein a material forming the plurality of 2$^{nd}$ metal structures has a higher conductivity than a material forming the initial 1$^{st}$ metal structure.

11. The method of claim 10, wherein the initial 1$^{st}$ metal structure comprises ruthenium (Ru), and the plurality of 2$^{nd}$ metal structures comprises copper (Cu), tungsten (W) or molybdenum (Mo).

* * * * *